United States Patent
Taub

(10) Patent No.: US 6,781,912 B2
(45) Date of Patent: Aug. 24, 2004

(54) PROVIDING PROTECTION AGAINST TRANSISTOR JUNCTION BREAKDOWNS FROM SUPPLY VOLTAGE

(75) Inventor: Mase J. Taub, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/335,824

(22) Filed: Dec. 31, 2002

(65) Prior Publication Data

US 2004/0124448 A1 Jul. 1, 2004

(51) Int. Cl.[7] .................................................. G11C 7/00

(52) U.S. Cl. .............. 365/226; 365/185.18; 365/189.09

(58) Field of Search ........................... 365/226, 185.18, 365/189.09

(56) References Cited

U.S. PATENT DOCUMENTS

| 6,013,932 | A | * | 1/2000 | Chevallier | 257/392 |
| 6,058,456 | A | | 5/2000 | Arimilli et al. | |
| 6,112,280 | A | | 8/2000 | Shah et al. | |
| RE36,932 | E | * | 10/2000 | Furutani | 365/226 |
| 6,182,194 | B1 | | 1/2001 | Uemura et al. | |
| 6,240,027 | B1 | * | 5/2001 | Lee et al. | 365/185.18 |
| 2004/0001357 | A1 | * | 1/2004 | Pekny | 365/185.18 |

* cited by examiner

Primary Examiner—Huan Hoang
(74) Attorney, Agent, or Firm—Trop, Pruner & Hu, P.C.

(57) ABSTRACT

An integrated power supply circuitry that supplies power in an integrated circuit to a chip may provide protection against transistor junction breakdowns from a supply voltage. For example, in a nonvolatile memory, such as a flash memory, a transistor PN-junction breakdown (e.g., a gate-aided drain-substrate PN-junction breakdown (BVD)) of metal silicon oxide (MOS) transistors may be prevented even though the supply voltage exceeds the BVD voltage limit thereof.

29 Claims, 4 Drawing Sheets

US 6,781,912 B2

PROVIDING PROTECTION AGAINST TRANSISTOR JUNCTION BREAKDOWNS FROM SUPPLY VOLTAGE

BACKGROUND

This invention relates generally to integrated power supply circuitry that is utilized for supplying power in integrated circuits.

Power supply circuitry is typically used to supply power to integrated circuits. One type of power supply circuitry is an integrated supply interface that is often preferred over other circuitry due to size and efficiency. For example, an integrated supply interface may be used to power a chip on an integrated circuit die. The chip circuitry may be implemented using metal oxide (MOS) transistors. However, MOS transistors have voltage limitations that depend on transistor features including gate length, oxide thickness, and doping implants. For example, the drain-substrate PN-junction of a MOS transistor may breakdown, creating a significantly large, and undesirable current through the drain-substrate PN-junction, when a high reverse bias voltage is applied to it. Moreover, the breakdown voltage of the drain-substrate PN-junction is a strong function of the voltage applied to the gate of a MOS transistor, causing the depletion region between the drain and substrate to pinch along the inner drain-substrate junction, underneath the gate. For large values of a drain-to-gate voltage $|V_{DG}|$, the depletion region is pinched sufficiently to further lower the breakdown voltage between the inner drain-substrate PN-junction. This type of breakdown is commonly referred to as gate-aided breakdown of the drain-substrate PN-junction (BVD).

As transistors, such the MOS transistors, are scaled to reduce cost and power, while improving speed, one or more of the transistor features that determine the voltage limitations of MOS transistors may be altered, lowering the supply voltage that may be safely applied. However, many chips, such as flash memory chips use a high voltage power supply (e.g., 12V) to perform memory functions such as program and erase operations, because large electric fields are required to move charge on and off of the floating gate, provide fast program and erase times, and enable backward compatibility with prior products. However, with the lower supply voltage in many fabrication processes deployed to produce memory chips, the gate-aided breakdown voltage has become lower than the desired supply voltage levels (e.g., 12V) for performing memory functions including programming and erasing operations in some flash memories.

Thus, there is a continuing need for better ways to supply power to integrated circuits to protect against transistor junction breakdowns.

DETAILED DESCRIPTION

Figure 1:
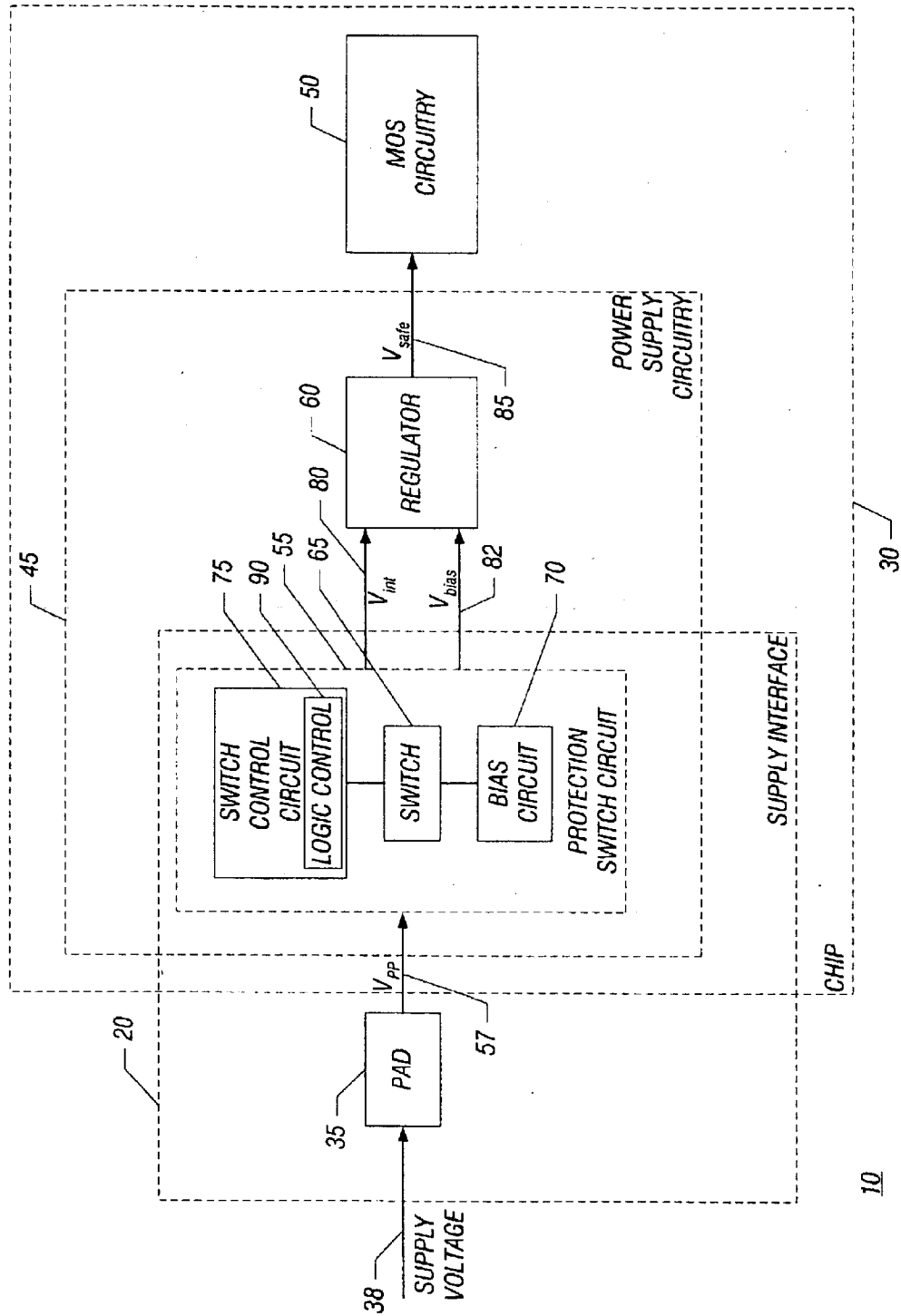
FIG. 1 is a schematic depiction of an integrated circuit, including a protection switch circuit for power supply circuitry, consistent with one embodiment of the present invention.

Referring to FIG. 1, an integrated circuit 10 may receive a supply voltage that may be adapted by a supply interface 20 into one or more voltage levels in accordance with one embodiment of the present invention. Based on the supply voltage, the supply interface 20 may apply power to a chip 30 on the integrated circuit 10 in one embodiment. The integrated circuit 10 may receive the supply voltage from a variety of external sources, such as a battery or any other suitable DC power supply. The supply interface 20 may include a pad 35 that receives a power supply signal 38 from the supply voltage for the chip 30. According to some embodiments of the present invention, the chip 30 may comprise power supply circuitry 45 which may be interposed between the pad 35 and metal oxide silicon (MOS) circuitry 50 on the integrated circuit 10. The power supply circuitry 45 may selectively apply an appropriate voltage level of the power supply signal 38 based on the supply voltage to the chip 30, according to some embodiments of the present invention.

The power supply circuitry 45 may comprise a protection switch circuit 55 coupled to a regulator 60. The protection switch circuit 55 may determine a particular supply voltage level for the regulator 60 based on the power supply signal 38. In one embodiment, the protection switch circuit 55 may comprise a switch 65, a bias circuit 70 and a switch control circuit 75 coupled together to provide an internal voltage signal (Vint) 80 and a bias voltage signal (Vbias) 82, respectively, to the regulator 60. In turn, the regulator 60 may provide a safe voltage signal (Vsafe) 85, i.e., a voltage level that may prevent a voltage higher than a gate-aided breakdown voltage (BVD) of a drain-substrate PN-junction at the MOS circuitry 50, consistent with many embodiments of the present invention.

For the purposes of biasing the internal voltage signal (Vint) 80 and generating the bias voltage signal (Vbias) 82 for the circuits including the regulator 60 and the MOS circuitry 50, the switch control circuit 75 may include a logic control 90, providing an appropriate supply voltage level for a given operation mode at the MOS circuitry 50. For example, a flash memory chip may operate on a plurality of different voltage levels to perform associated memory functions including read, program and erase operations.

Using the regulator 60, the power supply circuitry 45 may regulate down the power supply signal 38 to a safe voltage level from a pad voltage signal (Vpp) 57 during different modes of operation of the MOS circuitry 50. In one mode of operation, the safe voltage level may be the supply voltage obtained from the power supply signal 38 received at the pad 35 as the pad voltage signal (Vpp) 57. The supply voltage may substantially be applied to the integrated circuit 10 for driving the MOS circuitry 50 while preventing the transistor PN-junction breakdowns at the regulator 60 and the MOS circuitry 50, in accordance with many embodiments of the present invention. Another mode of operation of the MOS circuitry 50 may involve applying a voltage less than the power supply signal 38, providing protection against transistor PN-junction breakdowns using the protection switch circuit 55.

However, a protection bias may depend upon an overvoltage condition relating to the fabrication process of the integrated circuit 10. For example, in a certain fabrication process, the maximum supply voltage that may be safely applied to the MOS circuitry 50 may be less than the supply voltage available at the pad 35. In this example, the over-voltage condition may be avoided using the protection switch circuit 55. That is, the protection bias may prevent a gate aided, drain-substrate PN-junction breakdown at the chip 30 in the regulator 60 and the MOS circuitry 50, in accordance with some embodiments of the present invention.

Within the protection switch circuit 55, the switch 65 may either isolate or allow the pad voltage signal (Vpp) 57 to be supplied to the regulator 60. For this purpose, the switch 65 may operate in two states, namely an on or an off state, in one embodiment. Using the switch 65, the protection switch circuit 55 may either pass in full the power supply signal 38 as the internal voltage (Vint) 80 to the regulator 60 or may apply a partial supply voltage instead, depending upon the state of the switch 65. For example, when the switch 65 is in an off state, i.e., the protection switch circuit 55 is in an off condition, the internal voltage signal (Vint) 80 may be adapted to a voltage level that is safe for operating the protection switch circuit 55, essentially a level below the BVD voltage level of one or more MOS transistors located therein.

In operation, the protection switch circuit 55 may determine a certain bias for the internal voltage signal (Vint) 80 applied to the MOS circuitry 50 via the regulator 60. As a result, a voltage less than the full supply voltage may be applied within the protection switch circuit 55 during a first mode of operation of the MOS circuitry 50. During a second mode of operation of the MOS circuitry 50, the power supply signal 38 may be applied substantially at the same voltage level that is received at the pad 35. For the second mode, a protection bias may be generated for the circuits connected to the internal voltage signal (Vint) 80.

At the protection switch circuit 55, the bias circuit 70 may provide the bias voltage signal (Vbias) 82 to the regulator 60 by turning the switch 65 on. In other words, when the switch 65 is in the on state, the bias circuit 70 may provide the bias voltage signal (Vbias) 82 to the regulator 60, protecting both the circuitry of the regulator 60 and the MOS circuitry 50 by essentially avoiding an occurrence of the BVD. When the switch 65 is in on state, the bias circuit 70 may bias the power supply signal 38 by generating an appropriate bias level that causes the internal voltage signal (Vint) 80 to be safely applied to the regulator 60, de-biasing transistors inside the regulator 60.

When the power supply signal 38 is applied to the pad 35, the regulator 60 may be initially turned off until some memory function, such as a write, program or erase operation is indicated by the logic control 90 in the protection switch circuit 55. As one example, the MOS circuitry 50 may comprise a flash memory. Certain operations on a flash memory may require a high enough voltage (e.g., 10.5 volts) be applied to the flash memory during program and erase operations. Before performing program and erase operations on the flash memory, the switch 65 and the regulator 60 may initially be in a turned off state. However, both may be turned on allowing a supply voltage up to 12.6 volts to be applied without damaging the flash memory.

In some embodiments, for programming and/or erasing data on the flash memory, a command may be issued by a customer to the logic control 90 which may incorporate a state machine that may be a micro-controller. The state machine may transition through a sequence of events causing an appropriate voltage level to be applied to the transistors at the flash memory based on the command. In this manner, memory functions, such as the program and erase operations, may be completed at the flash memory even though it cannot handle 12-volt supply voltage. Higher voltage levels may be supplied to either program or erase data, as described above. Although in this example the state machine is indicated to be located at the logic control 90, in other embodiments the state machine may be suitably located at different regions of the power supply circuitry 45 or at the chip 30, providing the safe voltage signal (Vsafe) 85 to the MOS circuitry 50 (e.g., flash memory).

Figure 2:
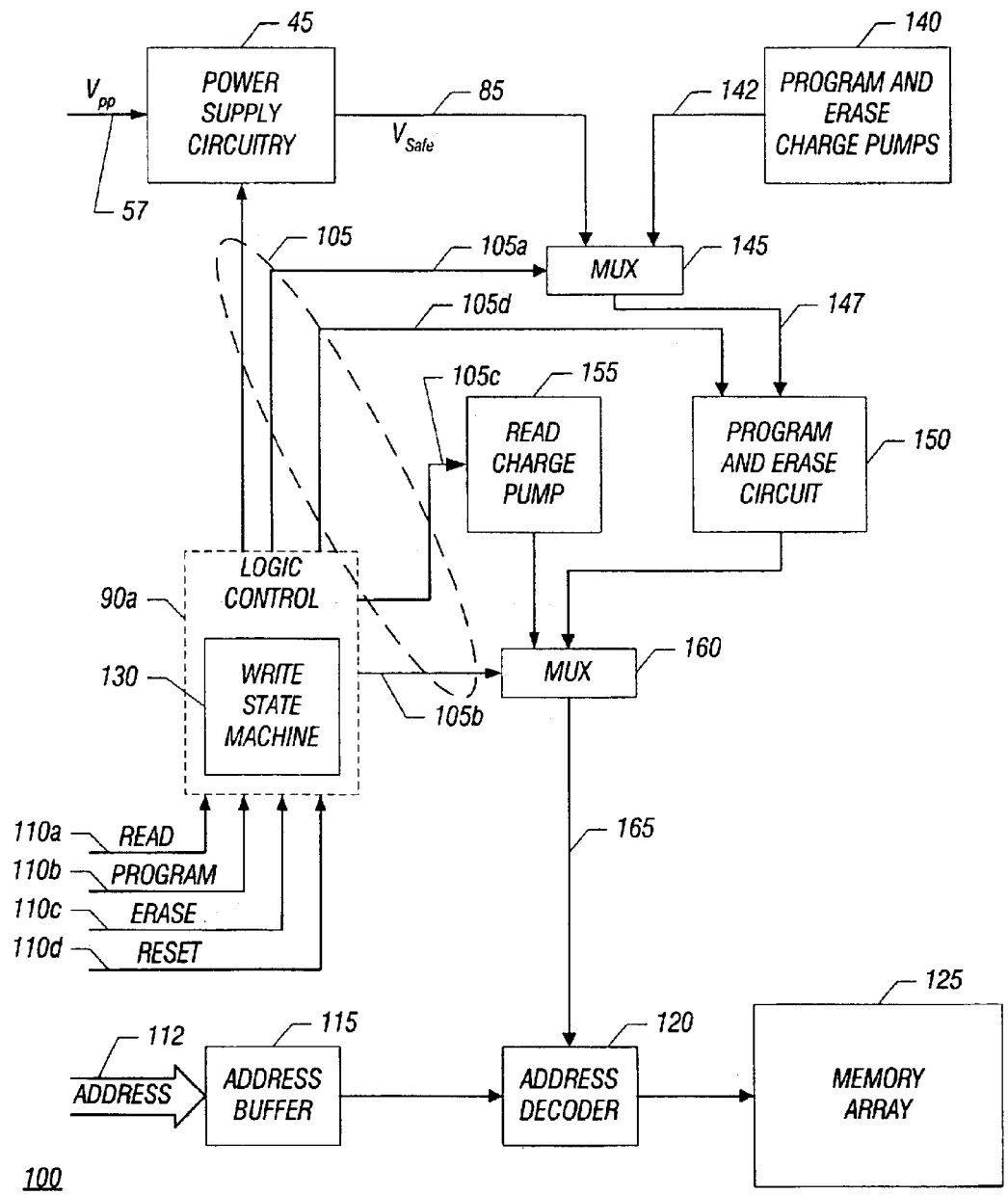
FIG. 2 is a schematic depiction of a nonvolatile memory utilizing the power supply circuitry shown in FIG. 1 according to one embodiment of the present invention.

Referring to FIG. 2, a nonvolatile memory 100 may receive a supply voltage, for example the pad voltage signal (Vpp) 57 to the power supply circuitry 45, providing the safe voltage signal (Vsafe) 85 at an appropriate voltage level using the bias voltage signal (Vbias) 82 (shown in FIG. 1) that may avoid a gate-aided, drain-substrate PN-junction breakdown, in accordance with some embodiments of the present invention. Specifically, the bias voltage signal (Vbias) 82 may prevent occurrence of the transistor junction breakdowns from the supply voltage within the nonvolatile memory 100. An example of the nonvolatile memory 100 is a flash memory comprising flash memory cells arranged in a flash memory array. A flash memory cell may include one or more transistors, such as metal oxide silicon (MOS) transistors which may be P-channel or N-channel transistors, including a corresponding gate, drain and a source terminal.

The nonvolatile memory 100 may comprise a logic control 90a to provide a set of different control signals 105, enabling different associated memory operations. To this end, the logic control 90a may receive one or more enable signals, including a read signal 110a, a program signal 110b, an erase signal 110c, and a reset signal 110d from an external source, such as memory configuring hardware and/or software, to selectively perform different memory operations at the nonvolatile memory 100, according to many embodiments of the present invention. In particular, the read signal 110a may provide for a memory read operation at the nonvolatile memory 100. Likewise, program and erase operations may be enabled in response to the program signal 110b and the erase signal 110c, respectively. The logic control 90a may issue a reset control signal responsive to the reset signal 110d in some embodiments.

The nonvolatile memory 100 may comprise an address buffer 115, an address decoder 120 and a memory array 125. The memory array 125 may store data, for example, bits of data depending upon a particular memory architecture deployed. In one embodiment, the memory array 125 may comprise a flash memory cell configurable to store data including multiple bits of data and multiple bits of data per cell. To access data on the memory array 125, a corresponding address may be buffered in the address buffer 115 from address information 112. Thereafter, the address may be decoded by the address decoder 120.

Consistent with one embodiment, to control different memory operations, the logic control 90a may comprise a write state machine 130 that may issue the control signals 105 to communicate with the address decoder 120. Using the logic control signals 105, the logic control 90a may provide control over the memory array 125 for passing data to be written into the memory array 125 or reading data therefrom, as two examples. Specifically, in response to the program signal 110b, the write state machine 130 may execute a sequence of events to write data into the memory array 125.

As a result, to program the nonvolatile memory 100, a voltage signal may be applied to the address decoder 120. Using the address information 112 buffered by the address buffer 115, the address decoder 120, in turn, may supply a program voltage level to the memory array 125. As an example, a voltage level obtained from the supply voltage may be used to program a particular memory cell in the memory array 125.

For the purposes of providing different memory operations including program and erase operations, the nonvolatile memory 100 may comprise program and erase charge pumps 140, generating appropriate voltage levels to the memory array 125 in many embodiments of the present invention. In one embodiment, the program and erase charge pumps 140 may be a DC-to-DC voltage converter that may generate a desired voltage level by selectively clocking capacitors and transistors in a prescribed sequence.

The voltage levels generated by the program and erase charge pumps 140 may be selectively applied to a first multiplexer 145. In response, the first multiplexer 145 may apply a signal to a program and erase circuit 150. Using the multiplexer 145, a particular voltage level may be provided to the memory array 125 to either program a particular memory cell therein, or to erase data from the memory cell, based on a control signal 105a received from the logic control 90a.

The first multiplexer 145 may select between the safe voltage signal (Vsafe) 85 and a voltage signal 142 coming from the program and erase charge pumps 140. Depending upon whether or not the pad voltage signal (Vpp) 57 requires boosting, for example, the voltage signal 142 may be boosted to a level that provides a programming voltage. In this manner, the first multiplexer 145 may then provide an appropriate voltage level to the program and erase circuit 150.

Unlike a program mode as described above in which a memory cell may be programmed, during a read mode a read charge pump 155 may provide a read voltage level (e.g., 5 volts) to a second multiplexer 160. The second multiplexer 160 may receive a program voltage level from the program and erase circuit 150 during a program or erase mode. To select between the read mode and the program or erase mode, the second multiplexer 160 may receive a control signal 105b from the logic control 90a. Likewise, to generate the read voltage at the read charge pump 155, the logic control 90a may issue a control signal 105c. In a similar fashion, the logic control 90a may send a control signal 105d to the program and erase circuit 150 during the program or erase mode.

While the first multiplexer 145 provides an output voltage 147 to the program and erase circuit 150, the read charge pump 155 may generate a read voltage based on the control signal 105c from the logic control 90a instead. Based on either the read voltage from the read charge pump 155 or a programming voltage from the program and erase circuit 150 in response to the control signal 150d, the second multiplexer 160 may provide an output voltage signal 165 which may be applied to the address decoder 120, supplying an appropriate voltage level signal to a memory cell in the memory array 125, in accordance with some embodiments of the present invention. Regardless, the voltage signals generated by the read charge pump 155 and the program and erase charge pumps 140 may eventually be coupled to the gate, drain or source terminals of memory the cells in the nonvolatile memory 100.

In one embodiment, the read charge pump 155 and the program and erase charge pumps 140 may include a number of different stages to generate the appropriate voltage levels. Likewise, the address buffer 115 and the address decoder 120 may be implemented using complementary metal oxide silicon (CMOS) transistors. Although embodiments of the present invention are described in conjunction with the memory array 125 of flash memory cells, other cells such as read only memory (ROM), erasable programmable read only memory (EPROM), conventional electrically erasable programmable read only memory (EEPROM) or dynamic random access memory (DRAM), to mention a few examples, may be used without departing from the spirit and scope of the present invention.

When neither programming or erasing (i.e., the control signal 105d to program and erase =0), a control signal to the power supply circuitry 45 may keep at a voltage low enough to avoid occurrence of BVD in the MOS transistors connected to the pad voltage signal (Vpp) 57 or connected to the safe voltage level (Vsafe) 85. During program and erase operations, the power supply circuitry 45 allows the power supply voltage (e.g., 12V) to be applied to the program and erase circuits. During this mode of operation a protection bias is generated in the power supply circuitry 45, which is used to protect the regulator 60 (FIG. 1) from BVD. In this way a customer may connect 12V to the nonvolatile memory 100, yet avoid BVD in program and erase circuits 150.

Figure 3:
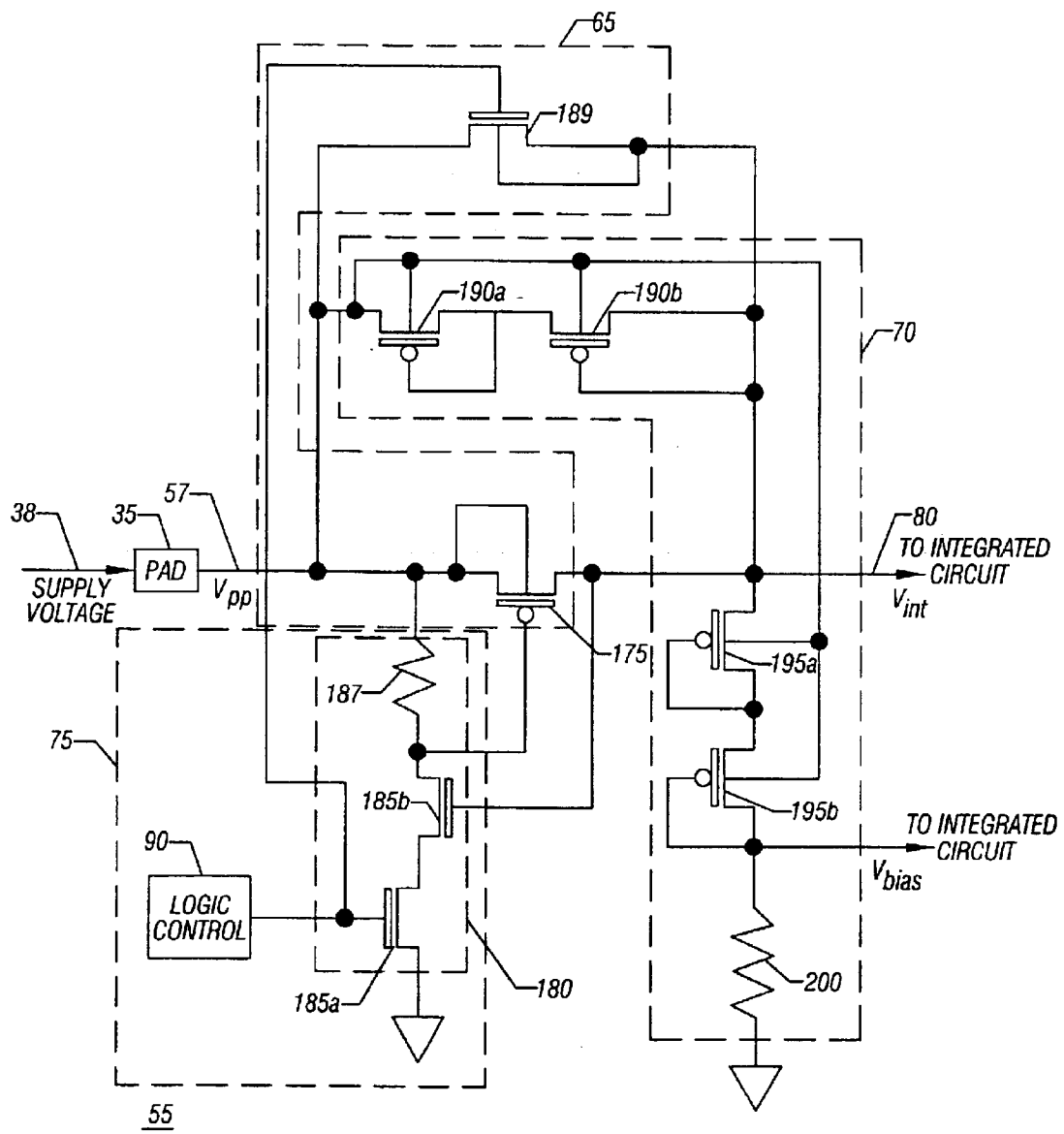
FIG. 3 is a schematic depiction of the protection switch circuit shown in FIG. 1 according to another embodiment of the present invention.

Referring to FIG. 3, the protection switch circuit 55 of the power supply circuitry 45 (shown in FIG. 1), in accordance with one embodiment of the present invention, may receive the power supply signal 38 for the integrated circuit 10 shown in FIG. 1 at the pad 35, providing the pad voltage signal (Vpp) 57 at the source of a P-channel MOS input transistor 175 of the switch 65. The input transistor 175 has its drain coupled to the integrated circuit 10 (not shown), which may apply the internal voltage signal (Vint) 80 to the regulator 60 (not shown). The drain of the input transistor 175 may form a P-N junction with the substrate thereof The gate of the input transistor 175 may be coupled to the switch control circuit 75 via a level shifter 180 for receiving a gate control signal. Based on the gate control signal to the gate of the input transistor 175, the bias voltage signal (Vbias) 82 may be selectively generated. Depending upon the supply voltage, the protection switch circuit 55 may either apply a voltage less than the supply voltage to the nonvolatile memory 100 or apply substantially the power supply signal 38 thereto. The switch control circuit 75 using the logic control 90 may generate an enable signal (i.e., a control signal 105) to selectively control the switching of the input transistor 175. Based on the enable signal, the input transistor 175 may transition between an on and off state.

While the input of the bias circuit 70 may be coupled to the source of the input transistor 175, the output may be coupled to the drain of the input transistor 175 to generate the bias voltage signal (Vbias) 82 based on the power supply signal 38, as described above in the context of FIG. 1. The bias circuit 70 may bias at a voltage level that protects the protection switch circuit 55 when the input transistor 175 transitions into the off state while protecting circuits connected to the internal supply signal (Vint) 80.

By causing the input transistor 175 to transition into the on state, when the switch control circuit 75 is activated in response to the enable signal, the input transistor 175 may substantially provide the power supply signal 38 as the internal supply signal (Vint) 80 to the nonvolatile memory 100. In this manner, upon receiving a supply voltage at the input transistor 175, a protection bias, e.g., the bias voltage signal (Vbias) 82 may be generated in response to the enable signal to substantially apply the supply voltage.

The level shifter 180 may comprise a pair of N-channel MOS transistors 185a and 185b, connected in series to a resistor 187. Specifically, while the drain of the N-channel series-connected transistor 185a may be coupled to the source of the N-channel MOS transistor 185b, the source of the N-channel MOS transistor 185a has its source grounded. The gate of the N-channel MOS transistor 185a is coupled to the logic control 90. The drain of the N-channel MOS transistor 185b may be coupled to one terminal of the resistor 187. The other terminal of the resistor 187 may be coupled to the source of the input transistor 175. The gate of the N-channel MOS transistor 185b is coupled to the drain of the input transistor 175.

The switch 65 may comprise the input transistor 175 and an N-channel MOS transistor 189, in one embodiment of the present invention. The N-channel MOS transistor 189 has its gate coupled to receive the enable signal (i.e., the control signal 105) from the logic control 90 at the gate of the N-channel MOS transistor 185a, while its drain is coupled to the source of the input transistor 175. The source of the N-channel MOS transistor 189 is coupled to the drain of the input transistor 175.

The bias circuit 70 may comprise a first pair of series-connected P-channel MOS transistors 190a and 190b coupled to a second pair of series-connected P-channel MOS transistors 195a and 195b. The bias circuit 70 may further comprise a resistor 200 that has one of its terminals coupled to the ground. The other terminal of the resistor 200 is coupled to the drain of the P-channel MOS transistor 195b. The source of the P-channel MOS transistor 195a is coupled to the drain of the input transistor 175. While the P-channel MOS transistor 190a has its source coupled to the source of the input transistor 175 and the drain of the N-channel MOS transistor 198, the P-channel MOS transistor 190b has its drain coupled to the drain of the input transistor 175 and the source of the N-channel MOS transistor 189.

In operation, the input transistor 175 may transition between two states, i.e., an on state and an off state. According to some embodiments of the present invention, the supply voltage may be furnished from a variety of external sources including a battery or a DC source, as two examples. The switch 65, which includes the input transistor 175, may be controlled by the switch control circuit 75, using the logic control 90. The bias circuit 70 may bias the internal voltage signal (Vint) 80 when the input transistor 175 is turned off by the switch control circuit 75, applying the gate control signal to the gate of the input transistor 175.

Accordingly, using the level shifter 180 the supply voltage may be isolated from the internal voltage signal (Vint) 80 because the input transistor 175 is turned off. This allows the bias circuit 70 to generate a reduced voltage level for the internal voltage signal (Vint) 80. By providing a voltage level below the gate-aided, drain-substrate P-N junction breakdown voltage level of the input transistor 175, when the input transistor 175 is in the off state, a BVD violation may be prevented in the protection switch circuit 55. When the input transistor 175 is in the on state, and the power supply signal 38 is connected to the pad 35, the power supply signal 38 may be passed as the internal voltage signal (Vint) 80 to the nonvolatile memory 100. However, the bias circuit 70 may generate an appropriate voltage level in the bias voltage signal (Vbias) 82 for biasing the nonvolatile memory 100 that receives the internal voltage signal (Vint) 80.

More specifically, the level shifter 180 may level shift the gate voltage, i.e., the gate control signal to the input transistor 175, turning the input transistor 175 off, and, in turn, keeping the switch 65 off. In this manner, the bias circuit 70 may bias the internal voltage signal (Vint) 80, providing a voltage level to the input transistor 175 that may protect against transistor junction breakdowns from the supply voltage in the circuits connected to the internal voltage signal (Vint) 80. That is, using the level shifter 180, the switch control circuit 75 may up-shift the gate voltage, i.e., the gate control signal to the input transistor 175, causing the input transistor 175 to turn off. As a result, when the input transistor 175 is turned off, the pad voltage signal (Vpp) 57 may not be connected to the internal voltage signal (Vint) 80. This allows the bias circuit 70 to divide this voltage between the first pair of P-channel MOS transistors 190a, 190b, and the second pair of P-channel MOS transistors 195a, 195b and to the resistor 200.

The logic control 90 may control the turning on or off operation of the input transistor 175 in some embodiments of the present invention. To turn the input transistor 175 off, the N-channel MOS transistor 185a is turned off. When the N-channel MOS transistor 185a is off, no significant current flows through the resistor 187, which is coupled to the source of the input transistor 175. This means that the input transistor 175 may remain off because the gate voltage, i.e., the gate control signal at the input transistor 175, is not lower than the source voltage by at least the threshold voltage (Vtp) of the input transistor 175.

As shown in FIG. 3, since the gates of the N-channel MOS transistor 189 and the N-channel MOS transistor 185a are connected to the logic control 90, an enable signal from the logic control 90 (e.g., logic "1") may cause both to turn on. When the logic control 90 asserts the gates of the N-channel MOS transistor 189 and the N-channel MOS transistor 185a, the N-channel MOS transistor 185b turns on. For the level shifter 180 to function, in one embodiment, the N-channel MOS transistor 189 ensures that the N-channel MOS transistor 185b is appropriately turned on when a low supply voltage level (e.g., 1 Volt) is applied to the pad voltage signal (Vpp) 57. By allowing the gate of the input transistor 175 to be grounded, the N-channel MOS transistor 185a then pulls down the gate voltage of the input transistor 175, turning on the input transistor 175. The bias circuit 70 may provide the bias when the input transistor 175 is turned on.

When the input transistor 175 is turned off, the pad voltage signal (Vpp) 57 may not connect to the internal voltage signal (Vint) 80 since the bias circuit 70 transistors and the resistor 200 bias the internal voltage signal (Vint) 80 to a safe voltage level. In one embodiment, as long as the input transistor 175 stays turned off, the N-channel MOS transistor 189 may substantially pass the internal voltage signal (Vint) 80 as the power supply signal 38. Specifically, the supply voltage (e.g., Vcc-Vtn) may be applied to the nonvolatile memory 100. In this case, the pad voltage signal (Vpp) 57 is shunted to the internal voltage signal (Vint) 80.

Instead, when the input transistor 175 is turned on using the second pair of P-channel MOS transistors 195a, 195b and the resistor 200 only, the pad voltage signal (Vpp) 57 may be allowed to connect to the internal voltage signal (Vint) 80, as the first pair of P-channel MOS transistors 190a, 190b may not have a significant effect on the biasing. The bias voltage signal (Vbias) 82 may then be further applied to the regulator 60 (not shown), protecting against a high voltage which may be applied as the internal voltage signal (Vint) 80 being substantially the power supply signal 38. For example, the power supply signal 38 may be 12.6 volt, even though the circuitry within the regulator 60 may be designed in a process capable of handling a lower specified supply voltage. In other words, using the regulator 60, the protection switch circuit 75 may apply the high voltage to the nonvolatile memory 100 because the protection switch circuit 75 controls what voltage level may be applied to the regulator 60.

Figure 4:
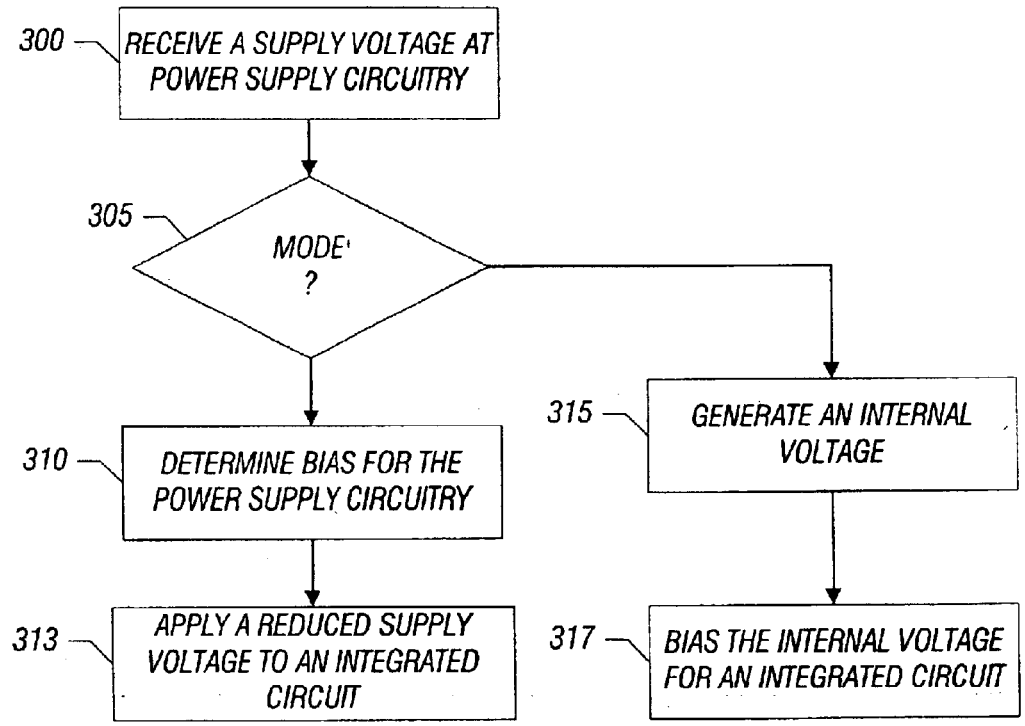
FIG. 4 is a chart showing providing protection against transistor junction breakdowns from a supply voltage in accordance with one embodiment of the present invention.

Referring to FIG. 4, a supply voltage may be received at the power supply circuitry 45 (FIG. 1) which may include the protection switch circuitry 75a at block 300. A check at diamond 305 may determine a particular mode of operation for the nonvolatile memory 100. For example, the nonvolatile memory 100 may be either in a program or erase mode or in a non-program or a non-erase mode.

When a program or erase mode is indicated at diamond 305, an appropriate bias level may be determined for the power supply circuitry 45 at block 310. In this case, at block 313, a reduced supply voltage based on the bias determined at block 310 may be applied to the integrated circuit 10, for example to the memory array 125 in the nonvolatile memory 100 using the protection switch circuit 55 shown in FIG. 1, consistent with some embodiments of the present invention. Otherwise, if a non-program or a non-erase mode is indicated at the diamond 305 for the nonvolatile memory 100, at the block 315 the internal voltage signal (Vint) 80 may be generated from the supply voltage, which may be biased and applied to the circuitry coupled to the protection switch circuit 55 at block 317.

Figure 5:
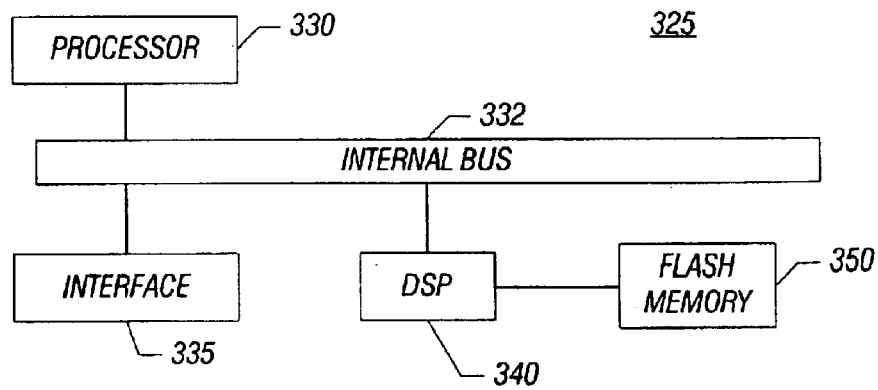
FIG. 5 is a schematic depiction of a system including the flash memory shown in FIG. 2 that utilizes the protection switch circuit of FIG. 1 according to one embodiment of the present invention.

A system 325 shown in FIG. 5 may include a processor 330, which may be coupled through an internal bus 332 to an interface 335. The processor 330 may be coupled through the internal bus 332 to a digital signal processor (DSP) 340 which may control the flash memory 350. The flash memory 350 is an example of the nonvolatile memory 100 shown in FIG. 2. The flash memory 350 may comprise multiple memory cells capable of storing data which may also include bits of data per memory cell. While the processor 330 provides control over the system 325, the digital signal processor 340 communicates with the flash memory 350. For example, the digital signal processor 340 may pass data either to be written into the flash memory 350 or read therefrom, based upon the sequence of commands from the processor 330.

In one embodiment, the system 325 including the processor 330, the interface 335, the digital signal processor 340, and the flash memory 350 may be located on a single integrated circuit die. Using a bias voltage in the power supply circuitry 45 (FIG. 1) located within the flash memory 350, a voltage higher than BVD may be prevented from being connected to the flash memory cells at the memory array of the flash memory 350. In this way, program and erase circuits in the flash memory 350 may be protected from a gate-aided, drain-substrate PN-junction breakdown.

As discussed above, by generating a protection bias, for example, the Vpp circuitry may be protected against BVD within the flash memory 350. In this manner, a supply voltage may be allowed to be applied to the flash memory 350 even though the supply voltage may exceed the acceptable BVD limit of a MOS transistor within the flash memory array of the flash memory 350 or the associated power supply circuitry.

Using the protection switch circuit 55 shown in FIG. 1, the supply voltage to an input pad may be adapted to a safe level for the flash memory 350. Also, using a bias voltage in the protection switch circuit 55 shown in FIG. 5, protection against transistor junction breakdowns which may occur as a result of the BVD may be substantially reduced within the flash memory 350, in some embodiments of the present invention. By providing an adequate protection against BVD fabrication processes having the BVD lower than the maximum allowed pad voltage signal (Vpp) 57 may be utilized to manufacture the flash memory 350. This may enable scaling up the manufacturing or fabrication process for the flash memory 350 while maintaining a supply voltage level of 12 volts, as one example. Accordingly, desired program and erase operations may be carried out in the flash memory 350 without altering hardware and/or software utilized for performing these operations in some embodiments of the present invention.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    an interface to develop a reduced supply voltage to an integrated circuit by selectively biasing the integrated circuit based on a transistor PN-junction breakdown voltage level.

2. The apparatus of claim 1, comprising:
    an input transistor having a gate, a source, a drain and a substrate, said gate coupled to receive a control signal, said source coupled to receive a supply voltage for the integrated circuit coupled to said drain; and
    circuitry coupled to said input transistor to selectively apply to the integrated circuit a voltage less than the supply voltage based on the control signal and to generate a bias signal for the integrated circuit to instead apply substantially the supply voltage thereto, wherein said drain forms a PN-junction with said substrate.

3. The apparatus of claim 2, said circuitry comprising:
    a first pair of series connected P-channel transistors including a corresponding drain and a corresponding source, one of said first pair of P-channel transistors having the corresponding drain coupled to the drain of said input transistor and the other one of said P-channel transistors having the corresponding source coupled to the source of said input transistor, wherein said input transistor is a P-channel transistor.

4. The apparatus of claim 3, said circuitry further comprising:
    a first resistor having a first and a second terminal, said first resistor coupled to the source of the input transistor at the first terminal thereof; and
    a pair of series connected N-channel transistors, including a respective drain and a respective source, one of said pair of N-channel transistors having the respective drain coupled to the gate of the input transistor and the second terminal of said first resistor, and the other one of said pair of N-channel transistors having the respective source coupled to the ground.

5. The apparatus of claim 4, wherein said circuitry comprising:
    an N-channel transistor having a gate, a source and a drain, said gate coupled to receive an enable signal at the gate of the other one of said N-channel transistors of the pair of N-channel transistors, said drain coupled to the source of said input transistor and said source coupled to the drain of said input transistor.

6. The apparatus of claim 5, said circuitry further comprising:
    a second resistor having a first and a second terminal, said second resistor coupled to the ground at the first terminal thereof; and a second pair of series-connected P-channel transistors, including a respective drain and a respective source, one of said second pair of P-channel transistors having the respective drain coupled to the second terminal of said second resistor, and the other one of said second pair of P-channel transistors having the respective source coupled to the drain of the input transistor.

7. A method comprising:
developing a reduced supply voltage to an integrated circuit by selectively biasing the integrated circuit based on a transistor PN-junction breakdown voltage level.

8. The method of claim 7 further comprising:
receiving a supply voltage at an input transistor for power supply circuitry of the integrated circuit; and
determining the transistor PN-junction breakdown voltage level.

9. The method of claim 7 further comprising:
providing an enable signal to control the input transistor; and
generating a bias signal at the power supply circuitry based on the enable signal to selectively apply substantially the supply voltage or the reduced supply voltage to the integrated circuit.

10. The method of claim 8 further comprising:
receiving the supply voltage at a pad for the input transistor; and
determining bias for the supply voltage to apply the reduced supply voltage to the input transistor.

11. The method of claim 10 further comprising:
providing the reduced supply voltage below the transistor PN-junction breakdown voltage level of the input transistor.

12. A device comprising:
circuitry to determine a transistor PN-junction power supply breakdown voltage level and to selectively develop a reduced supply voltage based on the transistor PN-junction breakdown voltage level.

13. The device of claim 12 further comprising:
an interface to receive a supply voltage;
a logic control to provide an enable signal; and
a circuit coupled to the logic control to generate a bias signal at the power supply circuitry based on the enable signal to selectively apply substantially the supply voltage or the reduced supply voltage to the integrated circuit.

14. The device of claim 13, said circuit further comprising:
an input transistor to receive the supply voltage, wherein said circuit to receive the supply voltage at the input transistor and determine bias for the supply voltage to apply the reduced supply voltage to the input transistor.

15. The device of claim 14, wherein said circuit to provide the reduced supply voltage below the transistor PN-junction breakdown voltage level of the input transistor.

16. A nonvolatile memory comprising:
power supply circuitry to determine a gate-aided drain-substrate PN-junction breakdown voltage level and to selectively develop a reduced supply voltage based on the gate-aided drain-substrate PN-junction breakdown voltage level.

17. The nonvolatile memory of claim 16, further comprising:
an interface to receive a supply voltage;
a logic control to provide an enable signal; and
a circuit coupled to the logic control to generate a bias signal at the power supply circuitry based on the enable signal to selectively provide substantially the supply voltage or the reduced supply voltage.

18. The nonvolatile memory of claim 17, said circuit comprising:
an input transistor to receive the supply voltage.

19. The nonvolatile memory of claim 18, wherein said circuit to receive the supply voltage at the input transistor and determine bias for the supply voltage to apply the reduced supply voltage to the input transistor.

20. The nonvolatile memory of claim 19, wherein said nonvolatile memory is a flash memory.

21. A method comprising:
selectively applying substantially a supply voltage or a voltage less than the supply voltage to an integrated circuit from a power supply circuitry using an enable signal that controls an input transistor in order to generate a bias signal at the power supply circuitry based on the enable signal.

22. The method of claim 21 comprising:
receiving the supply voltage at a pad for the input transistor; and
determining bias for the power supply circuitry to apply the voltage less than the supply voltage.

23. The method of claim 22 comprising:
providing the voltage less than the supply voltage at a level below the gate-aided drain-substrate PN-junction breakdown voltage level of the input transistor.

24. The method of claim 21 comprising:
biasing the integrated circuit using the bias signal based on a first mode of operation at the integrated circuit.

25. The method of claim 24, comprising:
receiving at the integrated circuit a second mode of operation different than the first mode of operation;
generating an internal voltage; and
biasing the internal voltage to prevent the gate-aided drain-substrate PN-junction breakdown for the integrated circuit.

26. The method of claim 25, comprising:
supplying power to program and erase circuitry of a nonvolatile memory located on the integrated circuit even though the supply voltage exceeds the gate-aided drain-substrate PN-junction breakdown of a metal silicon oxide transistor therein.

27. A system comprising:
a digital signal processor;
a nonvolatile memory coupled to said digital signal processor, said nonvolatile memory including,
a memory array;
a logic control coupled to said memory array to selectively program and erase said memory array; and
a circuit coupled to the logic control including,
an interface to receive a supply voltage;
circuitry coupled to the interface to determine a gate-aided drain-substrate PN-junction breakdown voltage level and to selectively develop a reduced supply voltage based on the gate-aided drain-substrate PN-junction breakdown voltage level.

28. The system of claim 27, said input transistor is a P-channel MOS transistor and the reduced supply voltage is below the gate-aided drain-substrate PN-junction breakdown of said circuit.

29. The system of claim 27, wherein the supply voltage exceeds the gate-aided drain-substrate PN-junction breakdown voltage level of said nonvolatile memory.

* * * * *